United States Patent
Campbell et al.

(10) Patent No.: US 7,701,760 B2
(45) Date of Patent: Apr. 20, 2010

(54) RESISTANCE VARIABLE MEMORY DEVICE WITH SPUTTERED METAL-CHALCOGENIDE REGION AND METHOD OF FABRICATION

(75) Inventors: Kristy A. Campbell, Boise, ID (US); Jon Daley, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 12/232,232

(22) Filed: Sep. 12, 2008

(65) Prior Publication Data
US 2009/0078925 A1 Mar. 26, 2009

Related U.S. Application Data

(60) Continuation of application No. 11/892,003, filed on Aug. 17, 2007, now Pat. No. 7,433,227, which is a division of application No. 11/193,425, filed on Aug. 1, 2005, now Pat. No. 7,274,034.

(51) Int. Cl.
*G11C 11/00* (2006.01)
(52) U.S. Cl. ............... 365/163; 365/148; 257/4; 438/95
(58) Field of Classification Search ........... 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |

(Continued)

FOREIGN PATENT DOCUMENTS

JP  5-6126916  10/1981

(Continued)

OTHER PUBLICATIONS

U.S. Appl. No. 10/916,421, filed Aug. 2004, Campbell.

(Continued)

*Primary Examiner*—Richard Elms
*Assistant Examiner*—Harry W Byrne
(74) *Attorney, Agent, or Firm*—Dickstein Shapiro LLP

(57) ABSTRACT

A chalcogenide-based programmable conductor memory device and method of forming the device, wherein a chalcogenide glass region is provided with a plurality of alternating tin chalcogenide and metal layers proximate thereto. The method of forming the device comprises sputtering the alternating tin chalcogenide and metal layers.

20 Claims, 5 Drawing Sheets

U.S. PATENT DOCUMENTS

| | | |
|---|---|---|
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowrey et al. |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowrey et al. |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,807 B2 | 7/2003 | Lowrey |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |

| | | |
|---|---|---|
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 7,138,290 B2 * | 11/2006 | McTeer ............... 438/95 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2004/0233728 A1 * | 11/2004 | Campbell et al. ...... 365/185.24 |
| 2006/0131556 A1 * | 6/2006 | Liu et al. ............... 257/5 |
| 2007/0166983 A1 * | 7/2007 | Liu et al. ............... 438/597 |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

U.S. Appl. No. 10/893,299, filed Jul. 2004, Campbell.
Abdel-All, A.; Elshafie, A.; Elhawary, M.M., DC Electric-field Effect in Bulk and Thin-film Ge5As38Te57 Chalcogenide Glass, Vacuum 59 (2000) 845-853.
Adler, D.; Moss, S.C., Amorphous Memories and Bistable Switches, J. Vac. Sci. Technol. 9 (1972) 1182-1189.
Adler, D.; Henisch, H.K.; Mott, S.N., The Mechanism of Threshold Switching in Amorphous Alloys, Rev. Mod. Phys. 50 (1978) 209-220.
Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.
Afifi, M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.
Alekperova, Sh.M.; Gadzhieva, G.S., Current-voltage Characteristics of Ag2Se Single Crystal Near the Phase Transition, Inorganic Materials 23 (1987) 137-139.
Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.
Angell, C.A., Mobile Ions in Amorphous Solids, Annu. Rev. Phys. Chem. 43 (1992) 693-717.
Aniya, M., Average Electronegativity, Medium-range-order, and Ionic Conductivity in Superionic Glasses, Solid State Ionics 136-137 (2000) 1085-1089.
Asahara, Y.; Izumitani, T., Voltage Controlled Switching in Cu-As-Se Compositions, J. Non-Cryst. Solids 11 (1972) 97-104.
Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.
Axon Technologies Corporation, Technology Description: *Programmable Metalization Cell (PMC)*, pp. 1-6 (pre-May 2000).
Baranovskii, S.D.; Cordes, H., On the Conduction Mechanism in Ionic Glasses, J. Chem. Phys. 111 (1999) 7546-7557.
Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.
Belin, R. Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.
Benmore, C.J.; Salmon, P.S., Structure of Fast Ion Conducting and Semiconducting Glassy Chalcogenide Alloys, Phys. Rev. Lett. 73 (1994) 264-267.
Bernede, J.C., Influence Du Metal Des Electrodes Sur Les Caracteristiques Courant-tension Des Structures M-Ag2Se-M, Thin Solid Films 70 (1980) L1-L4.
Bernede, J.C., Polarized Memory Switching in MIS Thin Films, Thin Solid Films 81 (1981) 155-160.
Bernede, J.C., Switching and Silver Movements in Ag2Se Thin Films, Phys. Stat. Sol. (a) 57 (1980) K101-K104.
Bernede, J.C.; Abachi, T., Differential Negative Resistance in Metal/insulator/metal Structures with an Upper Bilayer Electrode, Thin Solid Films 131 (1985) L61-L64.
Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.
Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.
Bondarev, V.N.; Pikhitsa, P.V., A Dendrite Model of Current Instability in RbAg4I5, Solid State Ionics 70/71 (1994) 72-76.
Boolchand, P., The Maximum in Glass Transition Temperature (Tg) Near x=1/3 in GexSe1-x Glasses, Asian Journal of Physics (2000) 9, 709-72.
Boolchand, P.; Bresser, W.J., Mobile Silver Ions and Glass Formation in Solid Electrolytes, Nature 410 (2001) 1070-1073.
Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolc hand, P.; Grothaus, J.; Bresser, W.J.; Suranyi, P., Structural Origin of Broken Chemical Order in a GeSe2 glass, Phys. Rev. B 25 (1982) 2975-2978.

Boolc hand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bress er, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G .; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., S emiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Bo er, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R. A Unified Mechanism for Metal Photodissolution in Amorphous Chalcogenide Materials, J. Non-Cryst. Solids 130 (1991) 85-97.

Elliot t, S.R., Photodissolution of Metals in Chalcogenide Glasses: A Unified Mechanism, J. Non-Cryst. Solids 137-138 (1991) 1031-1034.

Elsa manoudy, M.M.; Hegab, N. A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bres ser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B. ; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T. Keryvin, V.; Sangleboeuf, J.-C.; Serre, I.; Lucas, J. Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Ele ctrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p.-114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; S nell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5—Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x ($0<=x<=0.571$) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkat a, M.F.; Afifi M.A.; Labib, H.H.; Hegab, N. A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messouss i, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A .; Asokan, S.; Kumar, A., Evidence Concerning the Effect of Topology on Electrical Switching in Chalcogenide Network Glasses, Phys. Rev. B 54 (1996) 4413-4415.

Neale, R.G.; A seltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

O wen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Pop escu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.D.;Gage, S.M.;Choi,W.K.;Snell,A.J.;Owen,A.E., Amorphous Silicon Analogue Memory Devices, J. Non-Cryst. Solids 115 (1989) 168-170.

Rose,M.J.;Snel l,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stock er, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.,Ribes,M.;Flank,A.M.;Dexpert,H. ;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

W ang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

W est, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

\* cited by examiner

RESISTANCE VARIABLE MEMORY DEVICE WITH SPUTTERED METAL-CHALCOGENIDE REGION AND METHOD OF FABRICATION

This application is a continuation application of U.S. application Ser. No. 11/892,003, filed Aug. 17, 2007 now U.S. Pat. No. 7,433,227, which is a divisional application of U.S. application Ser. No. 11/193,425, filed Aug. 1, 2005, now U.S. Pat. No. 7,274,034, issued Sep. 25, 2007, the disclosures of which are incorporated herein by reference in their entirety.

FIELD OF THE INVENTION

The invention relates to the field of random access memory (RAM) devices formed using a resistance variable material.

BACKGROUND

Resistance variable memory elements, which include chalcogenide-based programmable conductor elements, have been investigated for suitability as semi-volatile and non-volatile random access memory devices. A typical such device is disclosed, for example, in U.S. Pat. No. 6,849,868 to Campbell, which is incorporated by reference.

In a typical chalcogenide-based programmable conductor memory device, a conductive material, such as silver, is incorporated into a chalcogenide glass. The resistance of the chalcogenide glass can be programmed to stable higher resistance and lower resistance states. An unprogrammed chalcogenide-based programmable conductor memory device is normally in a higher resistance state. A write operation programs the chalcogenide-based programmable conductor memory device to a lower resistance state by applying a voltage potential across the chalcogenide glass. The chalcogenide-based programmable conductor memory device may then be read by applying a voltage pulse of a lesser magnitude than required to program it; the resistance across the memory device is then sensed as higher or lower to define the ON and OFF states.

The programmed lower resistance state of a chalcogenide-based programmable conductor memory device can remain intact for an indefinite period, typically ranging from hours to weeks, after the voltage potentials are removed. The chalcogenide-based programmable conductor memory device can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such a device can function as a variable resistance memory having at least two resistance states, which can define two respective logic states, i.e., at least a bit of data.

One exemplary chalcogenide-based programmable conductor memory device uses a germanium selenide (i.e., $Ge_xSe_{100-x}$) chalcogenide glass as a backbone. The germanium selenide glass has, in the prior art, incorporated silver (Ag) and silver selenide ($Ag_2Se$).

Previous work by the inventor, Kristy A. Campbell, has been directed to chalcogenide-based programmable conductor memory devices incorporating a silver-chalcogenide material as a layer of silver selenide (e.g., $Ag_2Se$) or silver sulfide (e.g., $Ag_2S$) in combination with a silver-metal layer and a chalcogenide glass layer. The silver-chalcogenide materials are suitable for assisting in the formation of a conducting channel through the chalcogenide glass layer for silver ions to move into to form a conductive pathway.

Tin (Sn) has a reduced thermal mobility in $Ge_xSe_{100-x}$ compared to silver and the tin-chalcogenides are less toxic than the silver-chalcogenides, therefore tin-chalcogenides (e.g., SnSe) have also been found to be useful in chalcogenide-based programmable conductor memory devices to replace silver selenide. However, sputtering of tin selenide to form such devices has proven difficult due to the increased density of the sputtered layers. This increased density (e.g., ~6 g/cm³ sputtered compared to ~3 g/cm³ evaporated) can prevent the motion of silver ions into the chalcogenide glass, thereby preventing the memory device from functioning. Therefore, evaporative deposition techniques have been used to deposit such material, which is generally a less efficient, more costly, slower, and less controlled technique for deposition. However, evaporation deposition of tin selenide and silver also incorporates some oxygen into the resulting layer, which provides for the lower density and allows for more mobility of silver ions.

SUMMARY

In an exemplary embodiment, the invention provides a chalcogenide-based programmable conductor memory device having a layered stack with a region containing tin-chalcogenide and silver proximate a chalcogenide glass layer. The device comprising a chalcogenide glass layer and the region of tin-chalcogenide and silver is formed between two conductive layers or electrodes. The tin-chalcogenide and silver region is formed by sputter deposition of tin-chalcogenide and silver.

In an exemplary embodiment of the invention, the chalcogenide-based programmable conductor memory device contains alternating layers of tin selenide (e.g., $Sn_xSe$, where x is between about 0 and 2) and silver.

In an exemplary embodiment of the invention, the tin-chalcogenide and silver region is formed by alternation of sputtering of tin selenide and silver layers over the chalcogenide glass layer.

The above and other features and advantages of the invention will be better understood from the following detailed description, which is provided in connection with the accompanying drawings.

DETAILED DESCRIPTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, epitaxial silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "tin" is intended to include not only elemental tin, but tin with other trace metals or in various alloyed combinations with other metals as known in the semiconductor industry, as long as such tin alloy is conductive, and as long as the physical and electrical properties of the tin remain unchanged.

The term "tin-chalcogenide" is intended to include various alloys, compounds, and mixtures of tin and chalcogens (e.g., sulfur (S), selenium (Se), tellurium (Te), polonium (Po), and oxygen (O)), including some species which have an excess or deficit of tin. For example, tin selenide, a species of tin-chalcogenide, is a preferred material for use in the invention and may be represented by the general formula $Sn_{1+/-x}Se$. Though not being limited by a particular stoichiometric ratio between Sn and Se, devices of the present invention typically comprise an $Sn_xSe$ species where x ranges between about 0 and about 2, e.g., SnSe.

The term "chalcogenide glass" is intended to include glasses that comprise at least one element from group VIA (also know as group 16) of the periodic table. Group VIA elements (e.g., O, S, Se, Te, and Po) are also referred to as chalcogens.

Figure 1:
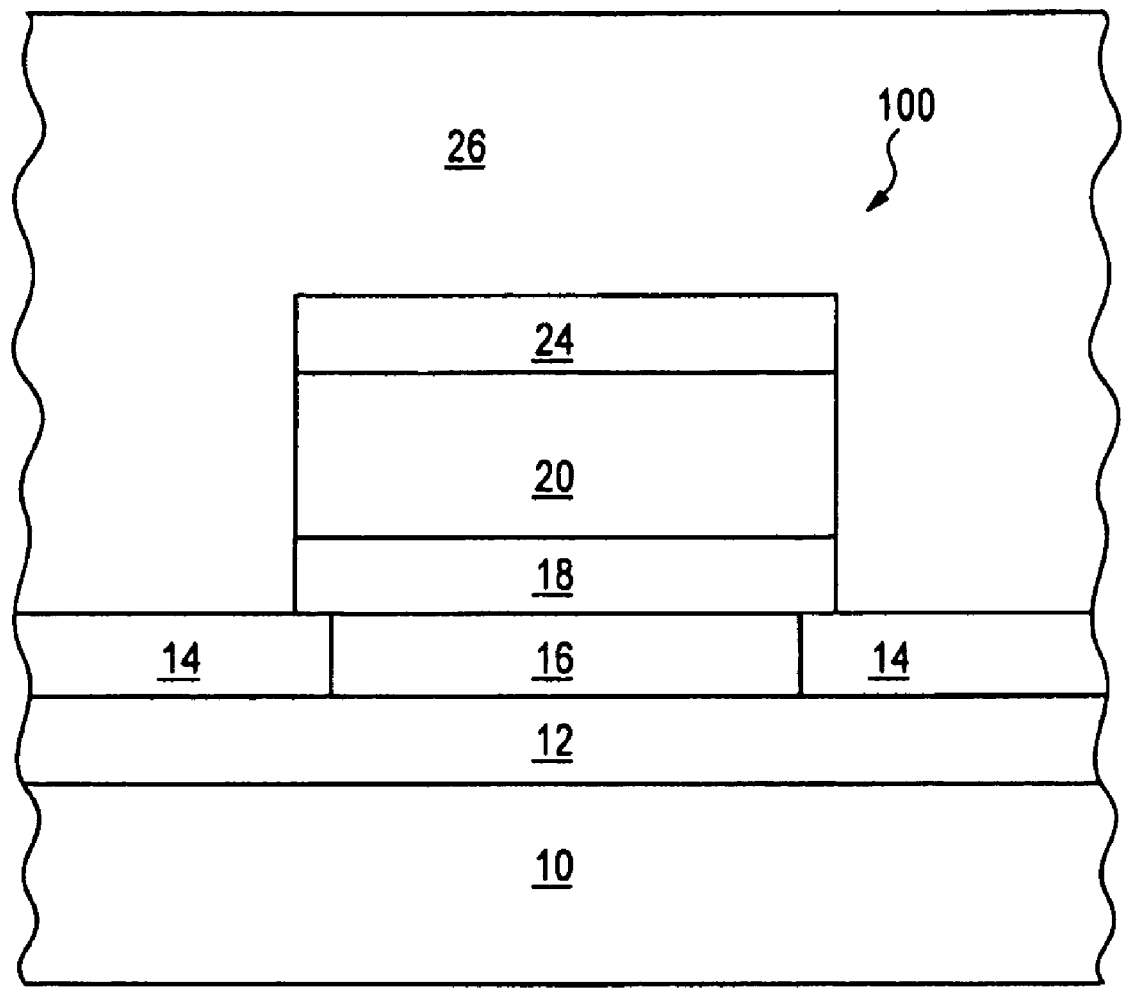
FIGS. 1 and 2 show exemplary embodiments of memory devices in accordance with the invention.

The invention is now explained with reference to the figures, which illustrate exemplary embodiments and throughout which like reference numbers indicate like features. FIG. 1 shows an exemplary embodiment of a memory device 100 constructed in accordance with the invention. The device 100 shown in FIG. 1 is supported by a substrate 10. Over the substrate 10, though not necessarily directly so, is a conductive address line 12, which serves as an interconnect for the device 100 shown and a plurality of other similar devices of a portion of a memory array of which the shown device 100 is a part. It is possible to incorporate an optional insulating layer (not shown) between the substrate 10 and address line 12, and this may be preferred if the substrate 10 is semiconductor-based.

The conductive address line 12 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials. Over the address line 12 is a first electrode 16, which can be defined within an insulating layer 14, if desired, and which is also over the address line 12. This electrode 16 can be any conductive material that will not migrate into chalcogenide glass, but is preferably tungsten (W). The insulating layer 14 should not allow the migration of silver (or other metal, e.g., copper) ions and can be an insulating nitride, such as silicon nitride ($Si_3N_4$), a low dielectric constant material, an insulating glass, or an insulating polymer, but is not limited to such materials.

A memory element, i.e., the portion of the memory device 100 which stores information, is formed over the first electrode 16. In the embodiment shown in FIG. 1, a layer of chalcogenide glass 18, preferably a germanium chalcogenide such as germanium selenide ($Ge_xSe_{100-x}$), can be provided over the first electrode 16. The germanium selenide can be within a stoichiometric range of about $Ge_{20}Se_{80}$ to about $Ge_{43}Se_{57}$, preferably about $Ge_{40}Se_{60}$, i.e., $Ge_2Se_3$. The layer of chalcogenide glass 18 can be between about 100 Å and about 1000 Å thick, preferably about 300 Å thick. Layer 18 need not be a single layer of glass, but may also be comprised of multiple sub-layers of chalcogenide glass having the same or different stoichiometries. This layer of chalcogenide glass 18 is in electrical contact with the underlying electrode 16.

Over the chalcogenide glass layer 18 is a region 20 of tin-chalcogenide, preferably tin selenide ($Sn_xSe$, where x is between about 0 and 2), and silver, which are layered as shown in FIG. 14. Alternating layers of tin selenide and silver are utilized to provide a region 20 incorporating both materials, wherein the silver is dispersed throughout the tin selenide. It is also possible that other chalcogenide materials may be substituted for selenium here, such as sulfur, oxygen, or tellurium; however, selenium is preferred and the remainder of the description will describe the invention utilizing tin selenide. The tin selenide and silver region 20 is preferably about 1,000 Å to about 2,000 Å thick; however, its thickness depends, in part, on the thickness of the underlying chalcogenide glass layer 18. The ratio of the thickness of the tin selenide and silver region 20 to that of the underlying chalcogenide glass layer 18 can be at least about 1:1, preferably about 3.33:1 to about 6.67:1.

Still referring to FIG. 1, over the tin selenide and silver region 20 is a second electrode 24. The second electrode 24 can be made of the same material as the first electrode 16, but is not required to be so. In the exemplary embodiment shown in FIG. 1, the second electrode 24 is preferably tungsten (W). The device(s) may be isolated by an insulating layer 26. The memory device 100 shown in FIG. 1 is a simplified exemplary embodiment of the invention. Other alternative embodiments may have more glass layers, as shown, for example, in FIG. 2, or may be provided within a via or may be made of blanket layers over an electrode such as electrode 16. Also, alternative embodiments may provide a common electrode in place of the dedicated electrode 16, shown in FIG. 1.

In accordance with the embodiment shown at FIG. 1, in a completed memory device 100, the tin selenide and silver region 20 provides a source of tin selenide and silver, which is incorporated into chalcogenide glass layer 18 during a conditioning step after formation of the memory device 100. The tin selenide and silver region 20 may also provide silver selenide ($Ag_2Se$) and silver tin selenide ($Ag_xSn_ySe_z$) to condition the chalcogenide glass layer 18. Specifically, the conditioning step comprises applying a potential across the memory element structure of the device 100 such that material from the region 20 is incorporated into the chalcogenide glass layer 18, thereby forming a conducting channel in the chalcogenide glass layer 18. Movement of silver ions into or out of the conducting channel during subsequent programming respectively forms or dissolves a conductive pathway, which causes a detectable resistance change across the memory device 100.

Figure 2:
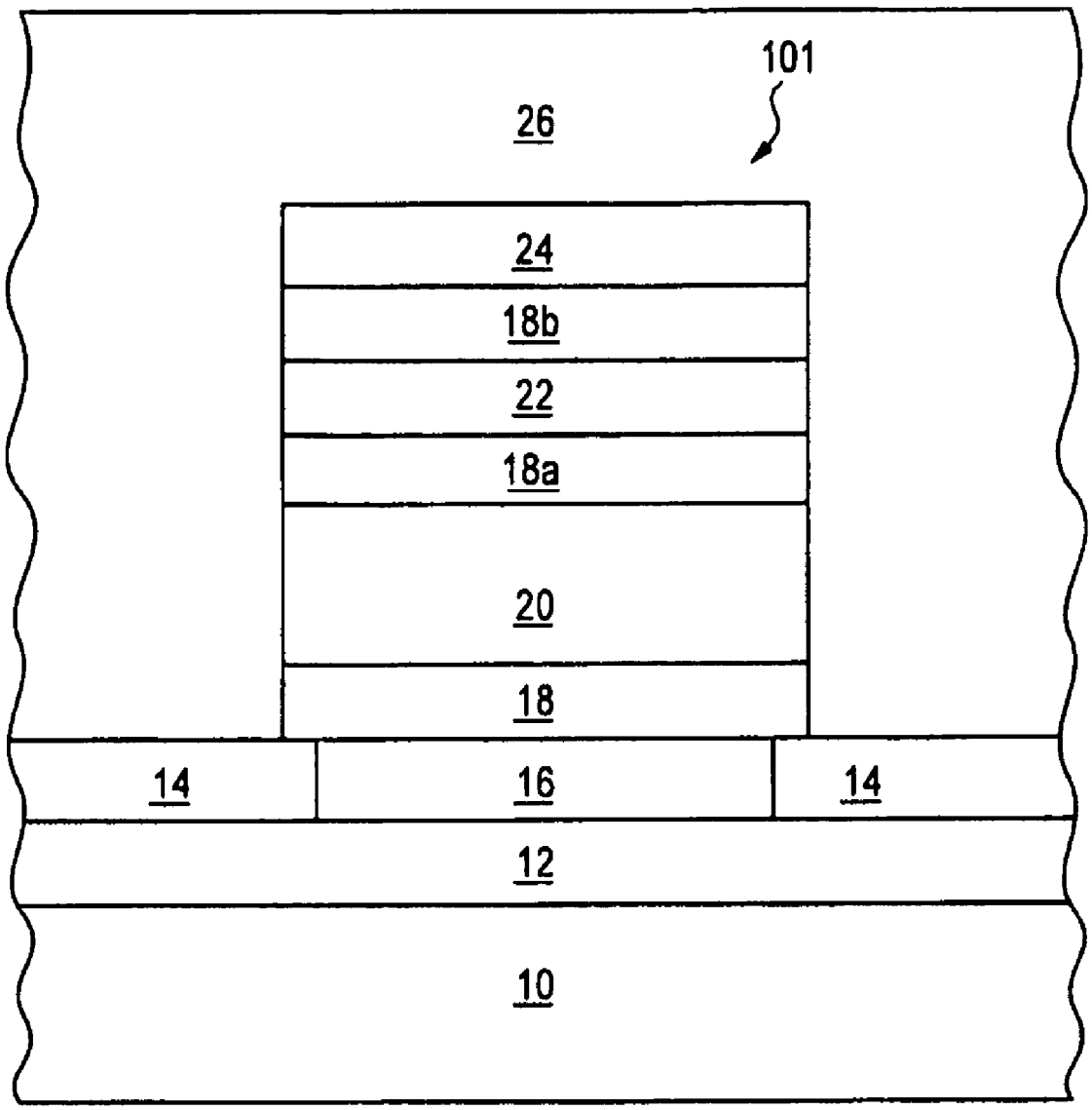

FIG. 2 shows another exemplary embodiment of a memory device 101 constructed in accordance with the invention. Memory device 101 has many similarities to memory device 100 of FIG. 1 and layers designated with like reference numbers are preferably the same materials and have the same thicknesses as those described in relation to the embodiment shown in FIG. 1. The primary difference between device 100 and device 101 is the addition to device 101 of an optional second chalcogenide glass layer 18a, a metal layer 22, and an optional third chalcogenide glass layer 18b.

The optional second chalcogenide glass layer 18a is formed over the tin selenide and silver region 20, is preferably $Ge_2Se_3$, and is preferably about 150 Å thick. Over this optional second chalcogenide glass layer 18a is a metal layer 22, which is preferably silver (Ag) and is preferably about 500 Å thick. Over the metal layer 22 is an optional third chalcogenide glass layer 18b, which is preferably $Ge_2Se_3$ and is preferably about 100 Å thick. The optional third chalcogenide glass layer 18b provides an adhesion layer for subsequent electrode formation. As with layer 18 of FIG. 1, layers 18a and 18b are not necessarily a single layer, but may be comprised of multiple sub-layers. Additionally, the optional second and third chalcogenide layers 18a and 18b may be a different chalcogenide glass from the first chalcogenide glass layer 18 or from each other.

Over the optional third chalcogenide glass layer 18b is a second electrode 24, which may be any conductive material, but is preferably not one that will migrate into the memory element stack and alter memory operation (e.g., not Cu or Ag), as discussed above for the preceding embodiments. Preferably, the second electrode 24 is tungsten (W).

FIGS. 3-6 illustrate a cross-sectional view of a wafer during the fabrication of a memory device 101 as shown by FIG. 2. Although the processing steps shown in FIGS. 3-6 most specifically refer to memory device 101 of FIG. 2, the methods and techniques discussed may also be used to fabricate other memory device structures, such as shown in FIG. 1, as would be understood by a person of ordinary skill in the art based on a reading of this specification.

Figure 3:
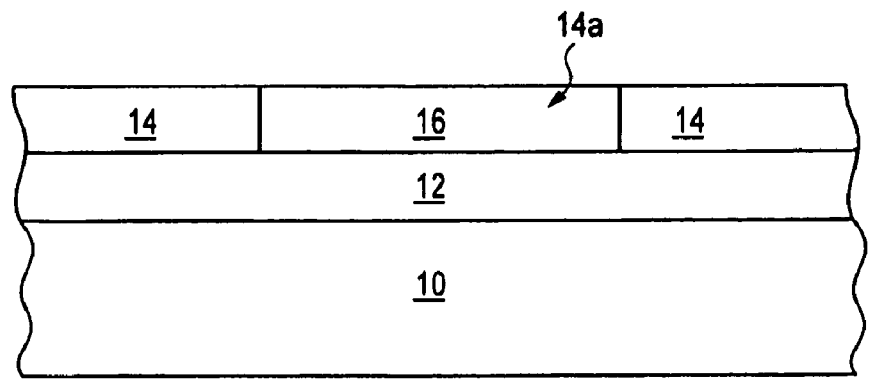
FIGS. 3-6 show exemplary sequential stages of processing during the fabrication of a memory device as in FIG. 2, in accordance with the invention.

As shown by FIG. 3, a substrate 10 is provided. As indicated above, the substrate 10 can be semiconductor-based or another material useful as a supporting structure for an integrated circuit, as is known in the art. If desired, an optional insulating layer (not shown) may be formed over the substrate 10; the optional insulating layer may be silicon nitride or other insulating materials used in the art. Over the substrate 10 (or optional insulating layer, if desired), a conductive address line 12 is formed by depositing a conductive material, such as doped polysilicon, aluminum, platinum, silver, gold, nickel, but preferably tungsten, patterning one or more conductive lines, for example, with photolithographic techniques, and etching to define the address line 12. The conductive material maybe deposited by any technique known in the art, such as sputtering, chemical vapor deposition, plasma enhanced chemical vapor deposition, evaporation, or plating.

Still referring to FIG. 3, over the address line 12 is formed an insulating layer 14. This layer 14 can be silicon nitride, a low dielectric constant material, or many other insulators known in the art that do not allow silver ion migration, and may be deposited by any method known in the art. An opening 14a in the insulating layer is made, for example, by photolithographic and etching techniques, thereby exposing a portion of the underlying address line 12. Over the insulating layer 14, within the opening 14a, and over the address line 12 is formed a conductive material, preferably tungsten (W). A chemical mechanical polishing (CMP) step may then be utilized, using the insulating layer 14 as a stop, to remove the conductive material from over the insulating layer 14, to leave it as a first electrode 16 over the address line 12, and planarize the wafer.

Figure 4:
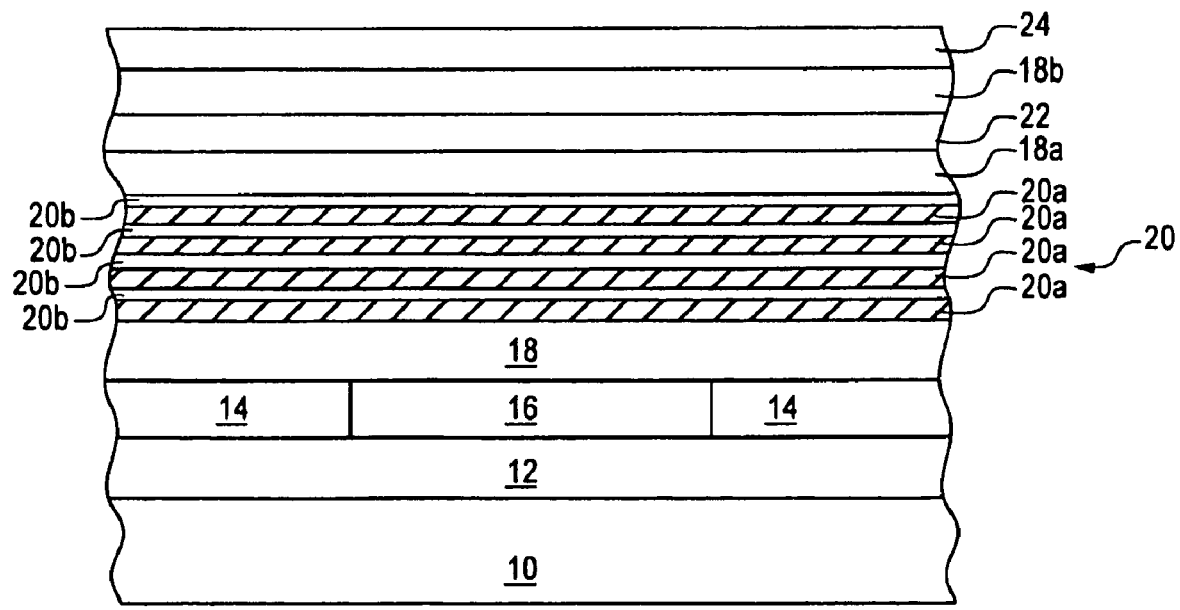

FIG. 4 shows the cross-section of the wafer of FIG. 3 at a subsequent stage of processing. A series of layers making up the memory device 101 (FIG. 2) are blanket-deposited over the wafer. A chalcogenide glass layer 18 is formed to a preferred thickness of about 300 Å over the first electrode 16 and insulating layer 14. The chalcogenide glass layer 18 is preferably $Ge_2Se_3$. Deposition of this chalcogenide glass layer 18 may be accomplished by any suitable method, such as evaporative techniques or chemical vapor deposition using germanium tetrahydride ($GeH_4$) and selenium dihydride ($SeH_2$) gases; however, the preferred technique utilizes either sputtering from a germanium selenide target having the desired stoichiometry or co-sputtering germanium and selenium in the appropriate ratios.

Still referring to FIG. 4, the tin selenide and silver region 20 is formed over the chalcogenide glass layer 18. To form region 20, alternating layers of tin selenide 20a and silver 20b are deposited by sputtering. Each tin selenide layer 20a is preferably between about 200 Å and about 400 Å. Each silver layer 20b is preferably between about 50 Å and about 100 Å. Sputtering these layers is preferred to evaporation deposition because of the increased efficiency, cost effectiveness, speed of fabrication, control of deposition rate, control of layer thickness, and control of layer properties provided by sputtering. Although the sputtered tin selenide and silver region 20 is denser than a like evaporated region, the proximity of the silver and the tin selenide layers 20b and 20a, respectively, allows for mixing and migration of these materials, heretofore not available to such sputtered regions.

Again, the thickness of region 20 is selected based, in part, on the thickness of layer 18; therefore, where the chalcogenide glass layer 18 is preferably about 300 Å thick, the alternating tin selenide layers 20a and silver layers 20b should make for a region 20 that is about 1,000 Å to about 2,000 Å thick. It should be noted that, as the processing steps outlined in relation to FIGS. 3-6 may be adapted for the formation of other devices in accordance the invention.

Still referring to FIG. 4, a second chalcogenide glass layer 18a is formed over the tin selenide and silver region 20, which can be sputtered similarly to the formation of layer 18. The second chalcogenide glass layer 18a is preferably a germanium selenide layer with a stoichiometry of $Ge_2Se_3$ and is preferably about 150 Å thick. Over the second chalcogenide glass layer 18a, a metal layer 22 is formed. The metal layer 22 is preferably silver (Ag), or at least contains silver, and is formed to a preferred thickness of about 500 Å. The metal layer 22 may be deposited by any technique known in the art. A third chalcogenide glass layer 18b is formed over the metal layer 22. This third chalcogenide glass layer 18b is also preferably germanium selenide with a stoichiometry of $Ge_2Se_3$, can be about 100 Å thick, and is preferably deposited by sputtering.

Still referring to FIG. 4, over the third chalcogenide glass layer 18b, a conductive material is deposited to form a second electrode 24 layer. Again, this conductive material may be any material suitable for a conductive electrode, but is preferably tungsten; however other materials may be used such as titanium nitride or tantalum, for example.

Figure 5:
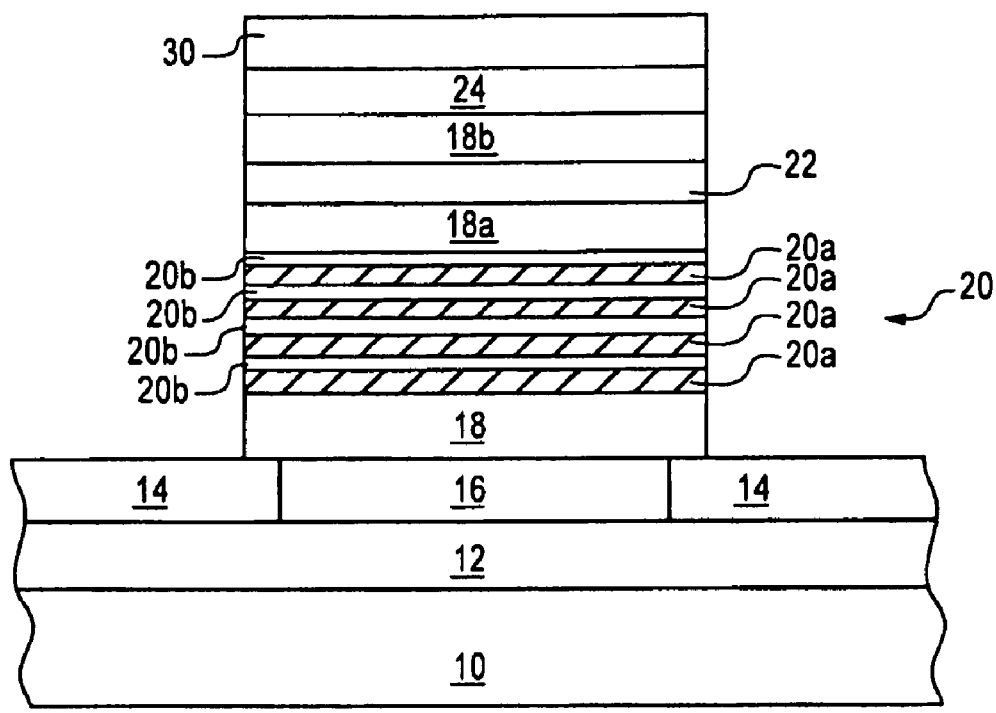
Figure 6:
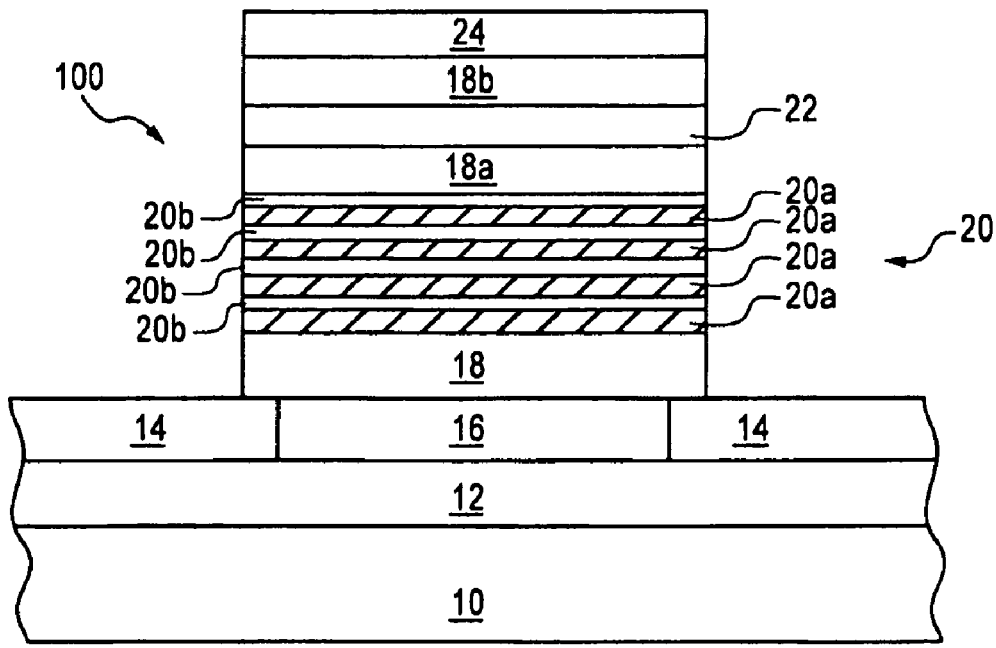

Now referring to FIG. 5, a layer of photoresist 30 is deposited over the top electrode 24 layer, masked and patterned to define the stacks for the memory device 101, which is one of a plurality of like memory devices of a memory array. An etching step is used to remove portions of layers 18, 20a, 20b, 18a, 22, 18b, and 24, with the insulating layer 14 used as an etch stop, leaving stacks as shown in FIG. 5. The photoresist 30 is removed, leaving a substantially complete memory device 101, as shown by FIG. 6. An insulating layer 26 may be formed over the device 101 to achieve a structure as shown by FIG. 2. This isolation step can be followed by the forming of connections to other circuitry of the integrated circuit (e.g., logic circuitry, sense amplifiers, etc.) of which the memory device 101 is a part, as is known in the art.

A conditioning step is performed by applying a voltage pulse of a given duration and magnitude to incorporate material from the tin selenide and silver region 20 into the chalcogenide glass layer 18 to form a conducting channel in the chalcogenide glass layer 18. The conducting channel will support a conductive pathway during operation of the memory device 101, the presence or lack of which provides at least two detectable resistance states for the memory device 101.

The embodiments described above refer to the formation of only a few possible chalcogenide-based programmable conductor memory device in accordance with the invention, which may be part of a memory array. It must be understood, however, that the invention contemplates the formation of other memory structures within the spirit of the invention, which can be fabricated as a memory array and operated with memory element access circuits.

Figure 7:
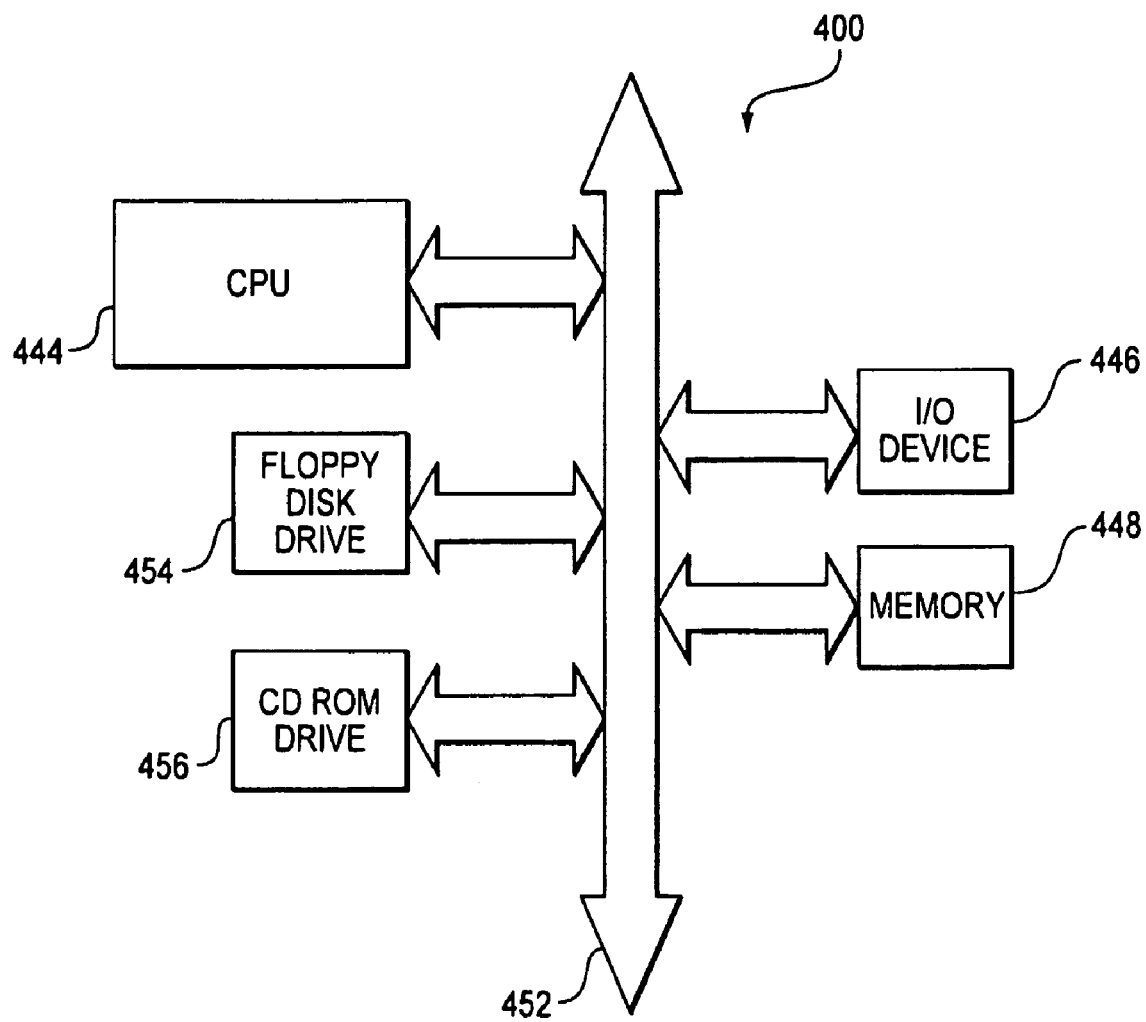
FIG. 7 shows an exemplary processor-based system incorporating a memory device in accordance with the invention.

FIG. 7 illustrates a processor system 400 which includes a memory circuit 448 employing chalcogenide-based programmable conductor memory devices (e.g., device 100 and 101) fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452, typically through a memory controller.

In the case of a computer system, the processor system may include peripheral devices, such as a floppy disk drive 454 and a compact disc (CD) ROM drive 456, which also communicate with CPU 444 over the bus 452. Memory circuit 448 is preferably constructed as an integrated circuit, which includes one or more resistance variable memory devices, e.g., device 101. If desired, the memory circuit 448 may be combined with the processor, for example CPU 444, in a single integrated circuit.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A memory device, comprising:
   a first electrode;
   a chalcogenide glass material formed over said first electrode;
   a tin chalcogenide material formed over said chalcogenide glass material;
   a first silver material formed over said tin chalcogenide material;
   a second silver material formed below said tin chalcogenide material; and
   a second electrode formed over said first electrode, said chalcogenide glass material, said tin chalcogenide material, said first silver material and said second silver material.

2. The memory device of claim 1, wherein said tin chalcogenide material comprises tin selenide.

3. The memory device of claim 1, wherein said chalcogenide glass material comprises germanium selenide.

4. The memory device of claim 3, wherein said germanium selenide has a stoichiometry of $Ge_2Se_3$.

5. The memory device of claim 1, further comprising a plurality of alternating tin chalcogenide layers and silver layers, said plurality of alternating tin chalcogenide layers and silver layers forming a region between about 1,000 Å and about 2,000 Å thick.

6. The memory device of claim 1, wherein the ratio of the thickness of said tin chalcogenide material and each of said first silver material and said second silver material is between about 3.33:1 and 6.67:1.

7. The memory device of claim 1, further comprising:
   a second chalcogenide glass material formed over said tin chalcogenide material, said first silver material and said second silver material;
   a metal material formed over said second chalcogenide glass material; and
   a third chalcogenide glass material formed over said metal material.

8. The memory device of claim 7, wherein said second chalcogenide glass layer is about 150 Å thick and said third chalcogenide glass layer is about 100 Å thick.

9. The memory device of claim 7, wherein said metal layer is about 500 Å thick.

10. The memory device of claim 1, wherein said memory device is part of a processor system, further comprising:
    a processor and memory circuit, wherein said memory circuit comprises said memory device.

11. The memory device of claim 1, wherein said chalcogenide glass material further comprises a plurality of sub-layers of chalcogenide glass material each having different stoichiometric properties.

12. The memory device of claim 1, wherein said chalcogenide glass material further comprises a plurality of sub-layers of chalcogenide glass material each having the same stoichiometric properties.

13. The memory device of claim 1, further comprising:
    a second chalcogenide glass material formed over said tin chalcogenide material, said first silver material and said second silver material;
    a metal material formed over said second chalcogenide glass material; and
    a third chalcogenide glass material formed over said metal material.

14. The memory device of claim 1, wherein said second chalcogenide glass material and said third chalcogenide glass material are each made from a different chalcogenide glass than said first chalcogenide glass material.

15. A method of forming a memory device, comprising:
    forming a chalcogenide glass layer over a first electrode;
    forming a tin chalcogenide layer over said chalcogenide glass layer;
    forming a first silver layer over said tin chalcogenide layer;
    forming a second silver layer below said tin chalcogenide layer; and
    forming a second electrode over said first electrode, said chalcogenide glass layer, said tin chalcogenide layer, said first silver layer and said second silver layer.

16. The method of claim 15, further comprising forming a plurality of sub-layers of chalcogenide glass within said chalcogenide glass layer.

17. The method of claim 15, further comprising:
forming a second chalcogenide glass layer over said tin chalcogenide layer, said first silver layer and said second silver layer;
forming a metal layer over said second chalcogenide glass layer; and
forming a third chalcogenide glass layer over said metal layer.

18. The method of claim 17, wherein said second chalcogenide glass layer and said third chalcogenide glass layer are each formed of a different chalcogenide glass than said first chalcogenide glass layer.

19. The method of claim 17, wherein said second chalcogenide glass layer and said third chalcogenide glass layer are each formed of the same chalcogenide glass as said first chalcogenide glass layer.

20. The method of claim 15, wherein said first electrode is formed of tungsten.

* * * * *